United States Patent [19]

Morrow et al.

[11] 4,044,310
[45] Aug. 23, 1977

[54] CIRCUITRY FOR GENERATING A SINE WAVE AND/OR COSINE WAVE FROM A PULSE SIGNAL

[75] Inventors: Robert S. Morrow, Columbus; Lloyd D. Penn, Johnstown, both of Ohio

[73] Assignee: IRD Mechanalysis, Inc., Columbus, Ohio

[21] Appl. No.: 637,751

[22] Filed: Dec. 4, 1975

Related U.S. Application Data

[62] Division of Ser. No. 420,594, Nov. 30, 1973, Pat. No. 3,938,394.

[51] Int. Cl.$^2$ .............................................. H03K 5/08
[52] U.S. Cl. ...................................... 328/27; 307/261
[58] Field of Search ........................... 328/27; 307/261

[56] References Cited

U.S. PATENT DOCUMENTS

| | | | |
|---|---|---|---|
| 3,340,476 | 9/1967 | Thomas et al. | 307/261 |
| 3,349,257 | 10/1967 | Thomas et al. | 328/27 |
| 3,659,141 | 4/1972 | Kubala | 307/288 |
| 3,774,115 | 11/1973 | Greiner | 307/261 |

*Primary Examiner*—Stanley D. Miller, Jr.

*Attorney, Agent, or Firm*—Harry B. Keck; George E. Manias

[57] ABSTRACT

Circuitry for generating a sine wave and/or a cosine wave from a pulse signal wherein cyclically repeating pulses each generate one cycle of a sine wave and/or a cosine wave. Each pulse institutes a sawtooth signal; a square wave generator produces a square wave having a positive excursion for one-half of the sawtooth signal and a negative excursion for the other half of the sawtooth signal. The square wave signal is integrated to produce a triangular wave. The triangular wave may be shaped into a simulated harmonic wave by wave-shaping circuitry. If both sine and cosine waves are desired, additional circuitry is employed to convert the described square wave to another square wave of the same frequency, 90° out of phase with the first square wave. The other square wave is converted to a corresponding triangular wave which is shaped to a simulated harmonic wave by wave-shaping circuitry.

Additional circuitry may be provided to compare the two square wave signals to assure that the resulting harmonic waves are in the desired phase relationship, i.e., a leading or lagging relationship as desired.

1 Claim, 7 Drawing Figures

CIRCUITRY FOR GENERATING A SINE WAVE AND/OR COSINE WAVE FROM A PULSE SIGNAL

CROSS-REFERENCES TO RELATED APPLICATIONS (IF ANY)

This application is a division of Ser. No. 420,594, filed Nov. 30, 1973, now U.S. Pat. No. 3,938,394.

BACKGROUND OF THE INVENTION

1. Field of the Invention:

The invention relates to electronic circuitry for generating sine and/or cosine waves from repetitive pulse input signals.

2. Description of the Prior Art:

Circuitry for generating reference sine waves and cosine waves in phase synchronism with cyclic pulses is known. See U.S. Pat. No. 3,501,965. Such prior art circuitry introduces small errors which preclude their use in fast response circuitry.

SUMMARY OF THE INVENTION

The text of U.S. Pat. No. 3,938,394 is incorporated by reference at this point, specifically, column 3, line 20, through column 3, line 45.

BRIEF DESCRIPTION OF THE DRAWINGS

FIG. 6 (corresponds to FIG. 17 of U.S. Pat. No. 3,938,394) is a schematic illustration of circuitry for providing a constant amplitude square wave signal regardless of the frequency of the input signal;

FIG. 7 (corresponds to FIG. 18 of U.S. Pat. No. 3,938,394) is a schematic illustration of the error gate circuitry appearing in FIG. 2.

DESCRIPTION OF THE PREFERRED EMBODIMENT(S)

Figure 1:
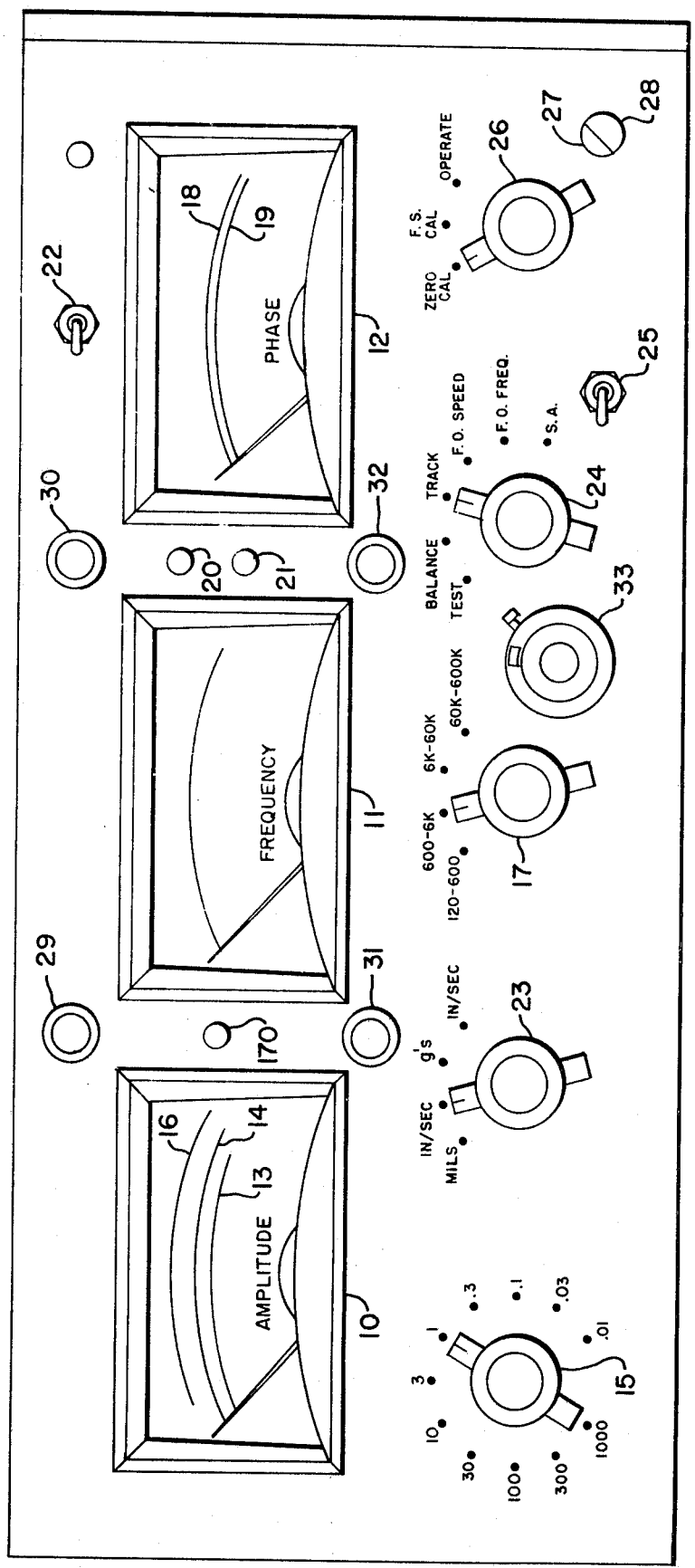
FIG. 1 is an illustration of the face of a housing for a spectrum analyzing balancing machine employing the present circuitry and illustrates meters, adjustment knobs and indicating lamps.
Figure 1A:
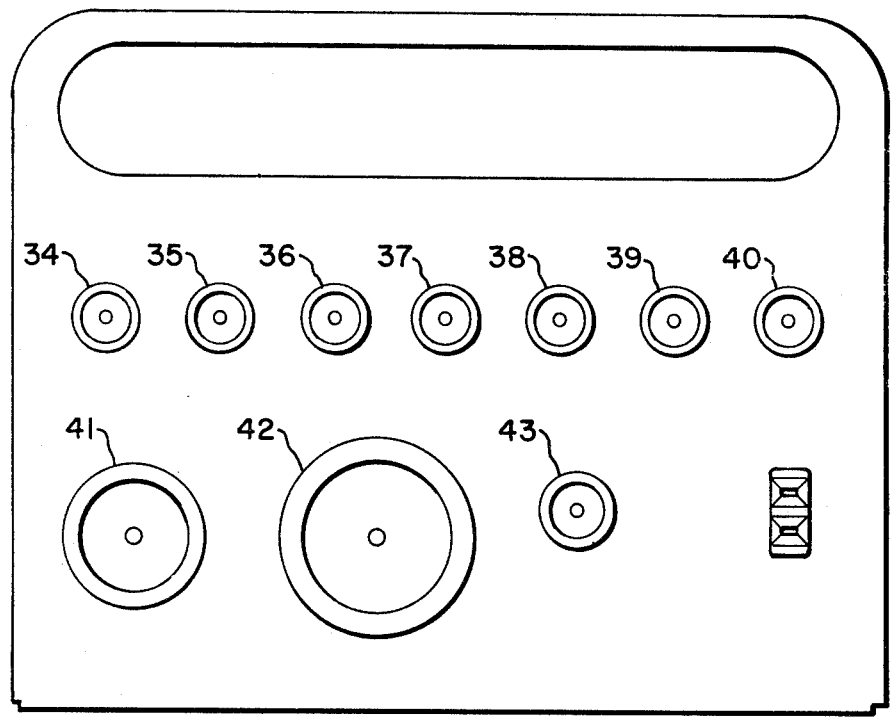
FIG. 1A is an illustration of one side of a housing shown in FIG. 1, presenting input and output jacks.
Figure 1B:
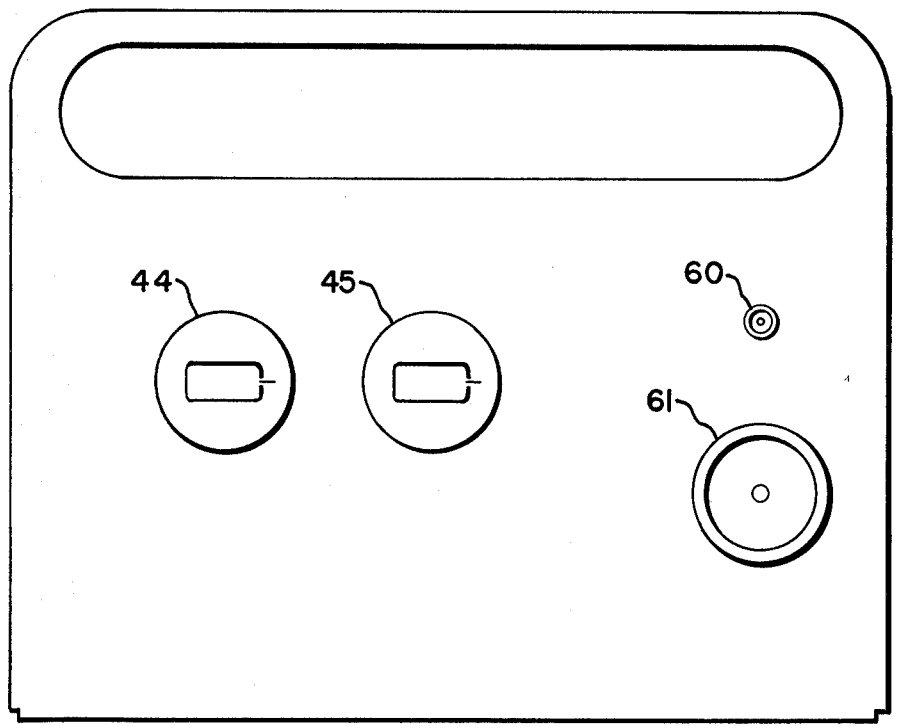
Figure 2:
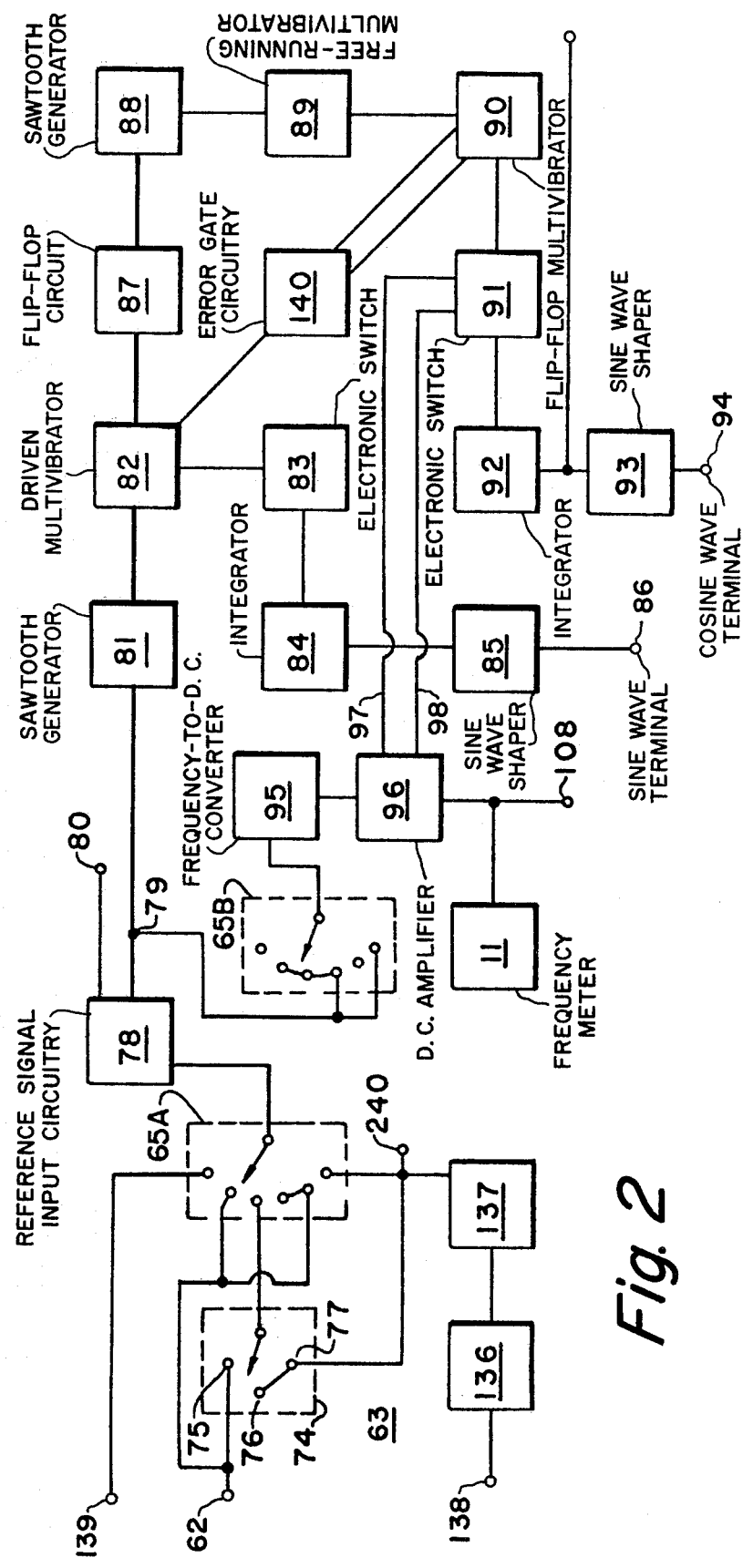
FIG. 2 is a schematic illustration of circuitry incorporating the circuitry of the present invention (corresponding to a portion of FIG. 2 of U.S. Pat. No. 3,938,394)
Figure 3:
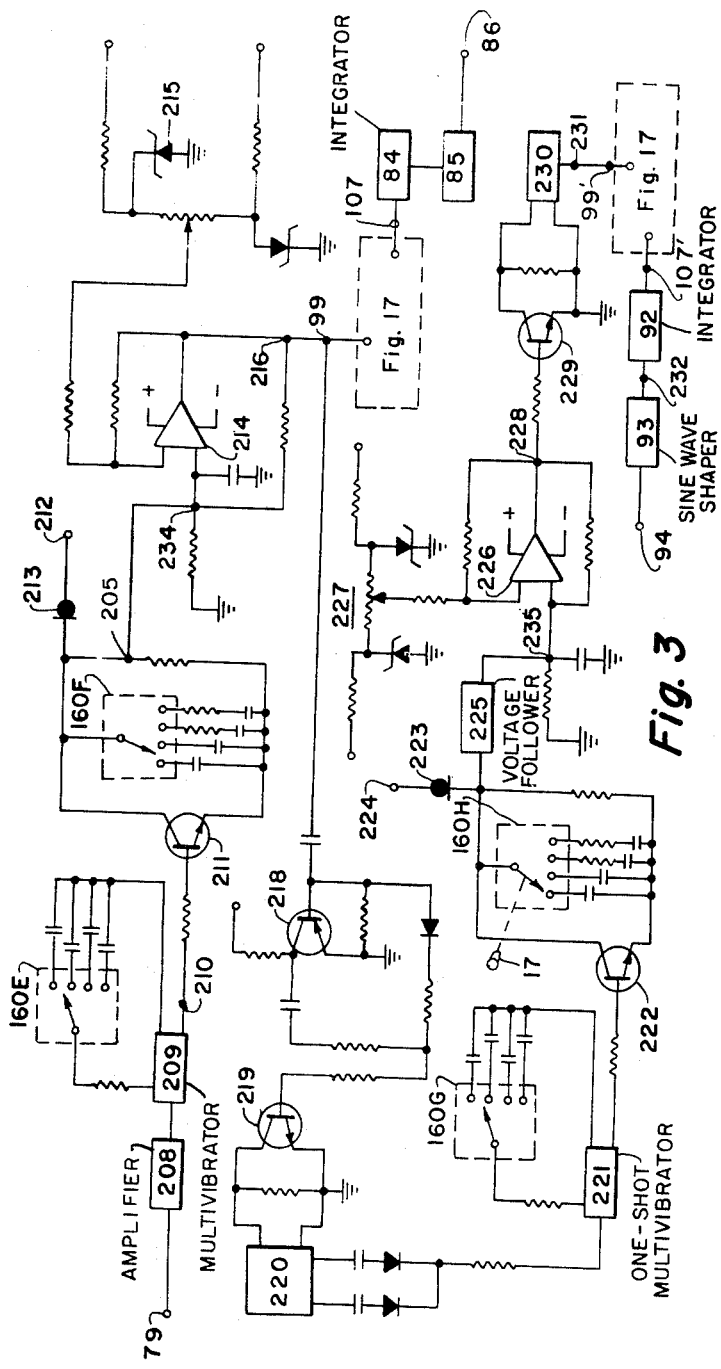
FIG. 3 (corresponds to FIG. 9 of U.S. Pat. No. 3,938,394) is a schematic illustration of a pulse to sine wave and pulse to cosine wave generator with which the present invention is concerned.
Figure 4:
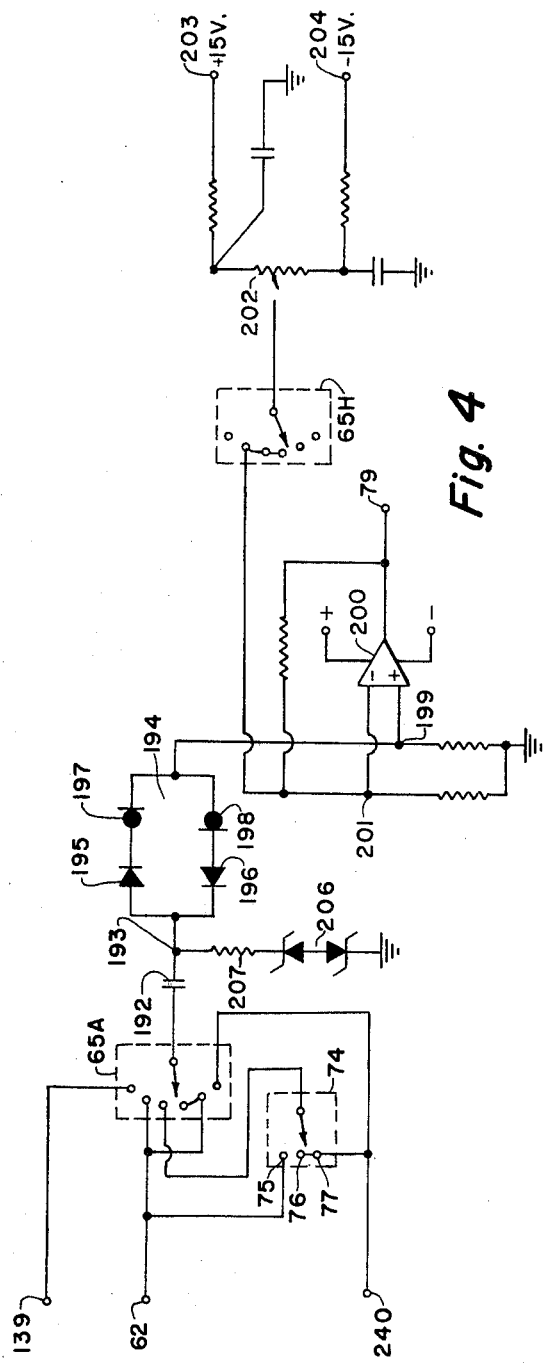
FIG. 4 (corresponds to FIG. 11 of U.S. Pat. No. 3,938,394) is a schematic illustration of a pulse signal conditioning circuit.
Figure 5:
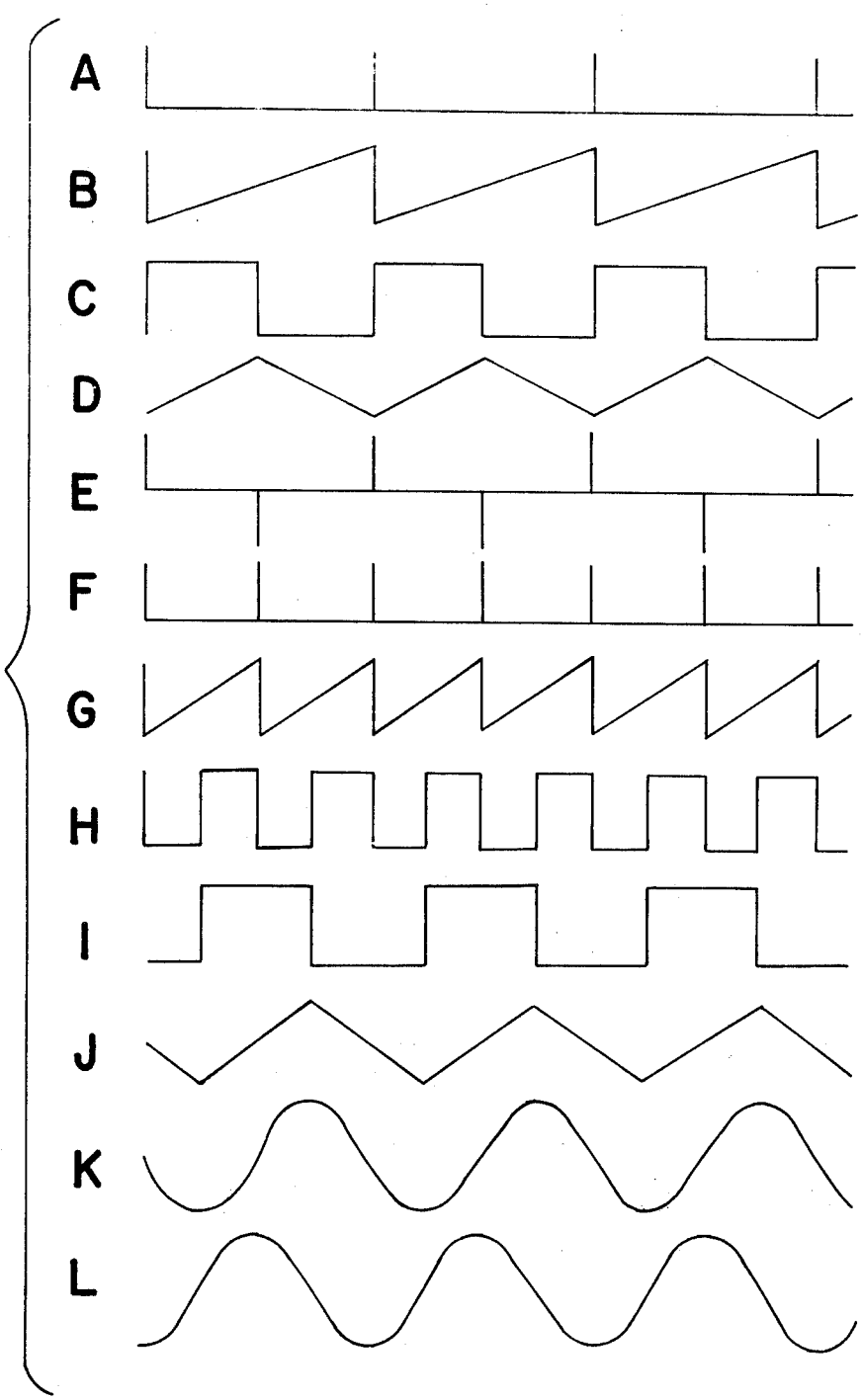
FIG. 5 (corresponds to FIG. 12 of U.S. Pat. No. 3,938,394) is a series of phase aligned wave forms illustrating certain signals within the pulse to sine wave and pulse to cosine wave circuitry of FIG. 3.

The text of U.S. Pat. No. 3,938,394 is incorporated herein by reference, specifically the portion commencing at column 8, line 13, and terminating at column 10, line 46; also the portion commencing at column 19, line 24, and terminating at column 22, line 59.

We claim:

1. In an electronic circuit for generating a sine wave and a corresponding cosine wave each having a fundamental frequency corresponding to the frequency of repetitive voltage input pulses, including:

A. means for generating the said sine wave including:
  means responsive to each pulse for generating a uniformly changing electrical sawtooth signal;
  a square wave generator which generates a first square wave signal having a positive excursion corresponding to one-half of the said sawtooth signal and having a negative excursion corresponding to the other half of the said sawtooth signal;
  means for integrating the said first square wave signal to produce a first triangular wave having a fundamental frequency identical to the frequency of the said input pulses; and
  sine wave shaping means to convert the said first triangular wave to the desired sine wave;

B. means for generating the said cosine wave including means for generating from the first said square wave signal a second sawtooth signal having exactly twice the frequency of the said first sawtooth signal;
  a second square wave generator which generates a second square wave signal having a positive excursion corresponding to one-half of the said second sawtooth signal and having a negative excursion corresponding to the other half of the said second sawtooth signal;
  a third square wave generator which generates a third square wave signal at twice the frequency of the said second square wave signal and 90° out of phase from the said first square wave signal;
  means for integrating the said third square wave signal to produce a second triangular wave having a fundamental frequency identical to the frequency of the said input pulses and being 90° out of phase from the first triangular wave;
  sine wave shaping means to convert the said triangular wave to the desired cosine wave; and
  comparison means for comparing the said first square wave signal with the said second square wave signal to maintain the desired phase relationship between the third square wave signal and the first square wave signal.

* * * * *